US00RE42233E

(19) United States
(12) Reissued Patent
Kim et al.

(10) Patent Number: US RE42,233 E
(45) Date of Reissued Patent: Mar. 22, 2011

(54) PLASMA DISPLAY APPARATUS

(75) Inventors: Young Sung Kim, Yongin-si (KR); Kyung-Ku Kim, Seoul (KR); Hong Rae Cha, Seoul (KR); Myeong-Soo Chang, Woowang-si (KR); Byung-Gil Ryu, Seoul (KR)

(73) Assignee: LG Electronics Inc., Seoul (KR)

(21) Appl. No.: 11/850,296

(22) Filed: Sep. 5, 2007

Related U.S. Patent Documents

Reissue of:
(64) Patent No.: 6,940,226
Issued: Sep. 6, 2005
Appl. No.: 10/812,906
Filed: Mar. 31, 2004

(30) Foreign Application Priority Data

Apr. 1, 2003 (KR) ..... 10-2003-0020556

(51) Int. Cl.
*H01J 17/49* (2006.01)

(52) U.S. Cl. ..... 313/582; 313/479; 313/112; 313/583; 313/584; 313/585; 313/586; 313/587

(58) Field of Classification Search ..... 313/582–587, 313/490, 112, 479
See application file for complete search history.

(56) References Cited

FOREIGN PATENT DOCUMENTS

| | | |
|---|---|---|
| JP | 09-306366 | 11/1997 |
| JP | 11-024589 | 1/1999 |
| JP | 11-052875 | 2/1999 |
| JP | 2000-011902 | 1/2000 |
| JP | 2001-141972 | 5/2001 |
| JP | 2001-203958 | 7/2001 |
| JP | 2001-320193 | 11/2001 |
| JP | 2003-022027 | 1/2003 |
| JP | 2003-066854 | 3/2003 |
| KR | 1020010012807 | 2/2001 |

*Primary Examiner*—Hana S Featherly
(74) *Attorney, Agent, or Firm*—KED & Associates, LLP

(57) ABSTRACT

Disclosed is a plasma display apparatus in which film-type front filter is connected. A plasma display apparatus of the present invention includes a panel formed by attaching an upper substrate to a lower substrate, an front filter attached to an entire surface of the panel and including extensions extending by predetermined lengths from edges of the panel in omni-directions, a back cover formed on a rear surface of the chassis base, and a filter supporter for electrically connecting the extensions to the back covers. The filter supporter is connected to the compass.

10 Claims, 5 Drawing Sheets

PLASMA DISPLAY APPARATUS

Matter enclosed in heavy brackets [ ] appears in the original patent but forms no part of this reissue specification; matter printed in italics indicates the additions made by reissue.

BACKGROUND OF THE INVENTION

1. Field of the Invention

The present invention relates to a plasma display apparatus, and more particularly, to a plasma display apparatus for connecting a film-type front filter.

2. Description of the Related Art

Plasma display panel (hereinafter referred to as "PDP") generally displays an image including character or graphic by exciting phosphor using ultraviolet rays with a wavelength of 147 nm, which is generated during a gas discharge of an inert mixture gas, such as He+Xe, Ne+Xe, He+Ne+Xe or the like. This PDP has easy slimness and large-sized characteristics, and provides a greatly improved picture quality thanks to the recent technology development. In particular, three-electrode alternating current (AC) surface discharge type PDP has advantages of a low voltage operation and a long life since wall charges stored on a surface in the course of discharge protect electrodes from sputtering generated by the discharge.

FIG. 1 is a view illustrating a discharge cell of a conventional three-electrode alternating current (AC) surface discharge type plasma display panel.

Referring to FIG. 1, a discharge cell of the three-electrode AC surface discharge type PDP includes a scan electrode (Y) and a sustain electrode (Z) formed on an upper substrate 10, and an address electrode (X) formed on a lower substrate 18. Each of the scan electrode (Y) and the sustain electrode (Z) includes transparent electrodes 12Y and 12Z and metal bus electrodes 13Y and 13Z having line widths narrower than line widths of the transparent electrodes 12Y and 12Z formed at one-sided edge regions of the transparent electrodes 12Y and 12Z.

The transparent electrodes 12Y and 12Z are generally formed of Indium-Tin-Oxide (Hereinafter, referred to as "ITO") on the upper substrate 10. The metal bus electrodes 13Y and 13Z are generally formed of chrome (Cr) on the transparent electrodes 12Y and 12Z to function to reduce a voltage drop caused by the transparent electrodes 12Y and 12Z having high resistance. An upper dielectric layer 14 and a passivation film 16 are layered on the upper substrate 10 having the scan electrode (Y) and the sustain electrode (Z) formed in parallel with each other. The wall charge generated at the time of plasma discharge is stored in the upper dielectric layer 14. The passivation film 16 prevents the upper dielectric layer 14 from being damaged due to the sputtering generating at the time of the plasma discharge and also, enhances an emission efficiency of a secondary electron. Magnesium oxide. (MgO) is generally used as the passivation film 16. A lower dielectric layer 22 and a barrier 24 are formed on the lower substrate 18 having the address electrode (X), and a fluorescent layer 26 is coated on a surface of the lower dielectric layer 22 and the barrier 24. The address electrode (X) is formed in a direction of crossing with the scan electrode (Y) and the sustain electrode (Z). The barrier 24 is formed in parallel with the address electrode (X) to prevent the visible ray and the ultraviolet ray caused by the discharge from being leaked to an adjacent discharge cell. The fluorescent layer 26 is excited by the ultraviolet ray generated due to the plasma discharge to radiate any one visible ray of red, green or blue. The inert mixed gas for the discharge such as He+Xe, Ne+Xe, He+Ne+Xe and the like is injected into a discharge space of the discharge cell provided between the upper/lower substrates 10 and 18 and the barrier 24.

In the PDP, one frame is divided for time-division driving into several sub-fields having different light-emitting times so as to embody a gray level of the image. Each of the sub-fields is divided into a reset period for which an entire screen is initialized, an address period for which a scan line is selected and a specific cell is selected at the selected scan line, and a sustain period for which the gray level is embodied depending on the light-emitting times.

For example, in case that the image is expressed using a 256 gray level as in FIG. 2, a frame period (16.67 ms) corresponding to 1/60 second is divided into eight sub-fields (SF1 to SF8). Also, each of the eight sub-fields (SF1 to SF8) is again divided into a reset period, an address period and a sustain period. Herein, the reset and address periods of each sub-field are identical every sub-field, whileas the sustain period is increased in a ratio of $2^n$ (n=0, 1, 2, 3, 4, 5, 6, 7) at each of the sub-fields.

In the above-driven PDP, a front filter for shielding an electromagnetic interference and also preventing an external light from being reflected is installed on a front surface of the upper substrate 10.

FIG. 3 is a schematic section view illustrating a portion of a conventional plasma display apparatus.

Referring to FIG. 3, the conventional plasma display apparatus includes a panel 32 where the upper substrate 10 and the lower substrate 18 are attached to each other with a gap therebetween, a front filter 30 installed at a front surface of the panel 32, a chassis base 36 for supporting the panel 32 and also mounting a printed circuit board thereon, a heat sink plate 34 attached to a front surface of the chassis base 36, a back cover 38 installed on a rear surface of the panel 32, and a front cabinet 45 for electrically connecting the back cover 38 and the front filter 30.

The front cabinet 45 includes a filter support portion 40 for electrically connecting the front filter 30 and the back cover 38, and a support member 42 for fixing and supporting the front filter 30 and the back cover 38. The filter support portion 40 supports the front filter 30 such that a rear surface of the front filter 30 is spaced away from the panel 32. Further, the filter support portion 40 electrically connects the EMI shield film included in the front filter 30 to the back cover 38 grounded to a ground voltage source to discharge an EMI signal from the EMI shield film. Also, the filter support portion 40 prevents the EMI from being laterally emitted.

The printed circuit board mounted on the chassis base 36 supplies a driving signal to electrodes (for example, a scan electrode, a sustain electrode and an address electrode) of the panel 32. For this, the printed circuit board includes various driving portions not shown. The panel 32 displays a certain image in response to the driving signal supplied from the printed circuit board. The heat sink plate 34 dissipates heat generated from the panel 32 and the printed circuit board. The back cover 38 protects the panel 32 from an external impact, and also shields an electromagnetic interference (Hereinafter, referred to as "EMI") laterally emitted.

The front filter 30 shields the EMI and also, prevents an external light from being reflected. For this, the front filter 30 includes an antireflection coating 50, an EMI shield film 54 and a near infrared ray (Hereinafter, referred to as "NIR") shield film 56. The front filter 30 additionally includes a glass and a color correction film 58. Herein, an adhesive layer is formed between respective films 50, 52, 54, 56 and 58 of the front filter 30 to adhere respective films 50, 52, 54, 56 and 58 to one another. Generally, a color correction pigment is added to the adhesive layer to form the color correction film 58. At this time, a structure of the front filter 30 can be a little varied depending on providers.

The antireflection coating 50 prevents incident light from being reflected to thereby enhance the contrast of the PDP. The antireflection coating 50 is formed on a front surface of the front filter 30, and may be further formed on a rear surface of the front filter 30. The optical characteristic film 52 lowers the brightness of red (R) and green (G) colors of the visible light applied from the panel 32, and enhances the brightness of blue (B) color of the visible light thereby improving the optical characteristics of the PDP.

The glass 54 protects the front filter 30 from external impact. The glass 54 supports the front filter 30 such that the glass 54 may protect the front filter 30 from external impact.

The EMI shield film 56 screens the EMI to prevent the EMI applied from the panel from being released to the external. The NIR shield film 58 screens the NIR irradiated from the panel 32 to prevent the NIR from being irradiated more than the standard to the external so that signal transfer apparatuses may normally transfer a signal by the NIR as a remote controller. The EMI shield film 56 and the NIR shield film 58 can be configured in one layer.

The front filter 30 is electrically connected to the back cover 38 through the filter supporter 40 as shown in FIG. 5. The filter supporter 40 is connected to an edge portion of the rear surface of the front filter 30. The filter supporter 40 is electrically connected to at least one of the EMI shield film 56 and the NIR shield film 58. Therefore, the filter supporter 40 connects the front filter 30 to the back cover 38 to thereby screen the EMI and/or the NIR.

The conventional front filter 30 is protected from external impacts by glass 54. Such front filter 30 is called a glass-type entire filter. If the glass 54 is inserted into the front filter 30, the front filter 30 becomes thicker, heavier and more expensive.

To solve the above-mentioned problems, the front filter without the glass had been suggested as shown in FIG. 6. The front filter is called film-type front filter.

The film-type front filter 60 includes an antireflection coating 62, an optical characteristic film 64, an EMI shield file 66 and an NIR shield film 68. Adherence layers are formed between films 62, 64, 66 and 68 of the film-type front filter 60 such that the films 62, 64, 66 and 68 are attached to adjacent ones. In general, the optical characteristic film 64 is formed by inserting a specific material into the adherence layers. The structure of film-type front filter 60 can be modified variously according to a user company. In FIG. 6, the adherence layer is not shown for the convenience for the description and the optical characteristic film is depicted as a specific layer.

The antireflection coating 62 is formed on a front surface of the film-type front filter 60 to prevent incident light from being reflected. The antireflection coating 62 may be further formed on a rear surface of the film-type front filter 60. The optical characteristic film 64 lowers the brightness of red (R) and green (G) colors of the visible light applied from the panel 32, and enhances the brightness of blue (B) color of the visible light thereby improving the optical characteristics of the PDP.

The EMI shield film 66 screens the EMI to prevent the EMI applied from the panel from being released to the external. The NIR shield film 68 screens the NIR irradiated from the panel 32 to prevent the NIR from being irradiated more than the standard to the external so that signals may be normally transferred from a remote controller to a panel 32. The EMI shield film 66 and the NIR shield film 68 can be configured in one layer.

The film-type front filter 60 is thinner, lighter and cheaper than the front filter 30 with the glass 54.

However, a plasma display apparatus with a film-type front filter and a method for manufacturing the same have not been suggested so that the film-type front filter is not widely used.

SUMMARY OF THE INVENTION

Accordingly, the present invention is directed to a plasma display apparatus that substantially obviates one or more problems due to limitations and disadvantages of the related art.

An object of the present invention is to provide a plasma display apparatus to which a film-type front filter can be easily connected.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a plasma display apparatus includes a panel formed by attaching an upper substrate to a lower substrate, an front filter attached to an entire surface of the panel and including extension extending by predetermined lengths from edges of the panel in omni-directions, a back cover formed on a rear surface of the chassis base, and a filter supporter for electrically connecting the extension to the back cover.

The extension may farther extend by 2 mm–300 mm from the edges of the panel, and may be formed of the same material as the film-type entire filter and integrated with the film-type entire filter.

The film-type entire filter may further include metallic material formed to surround the extension.

The filter supporter may include a clip for rotating with respect to a guide member in pitching direction, and a flange for connecting the filter supporter with the clip.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this applications, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Figure 7:
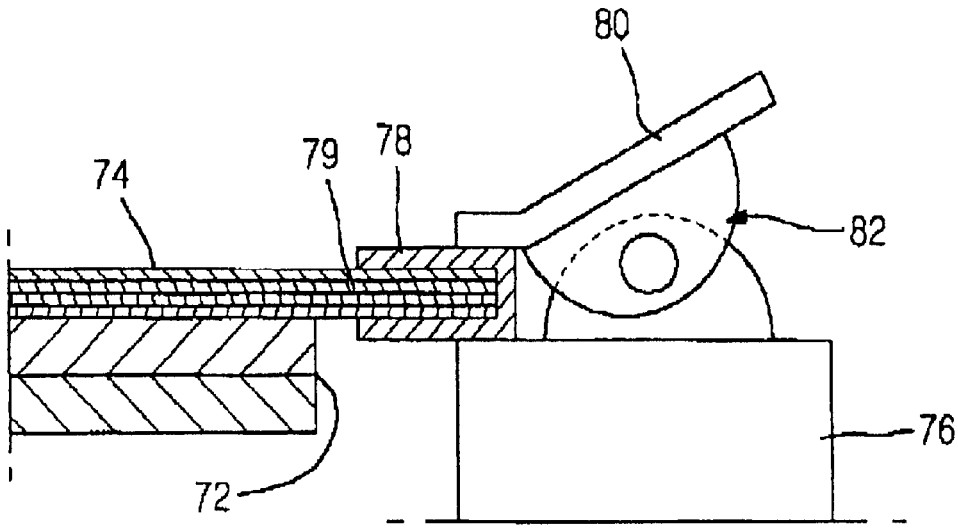
FIG. 7 illustrates a portion of a plasma display apparatus according to an embodiment of the present invention schematically.

FIG. 7 illustrates a portion of a plasma display apparatus according to an embodiment of the present invention schematically.

Figure 1:
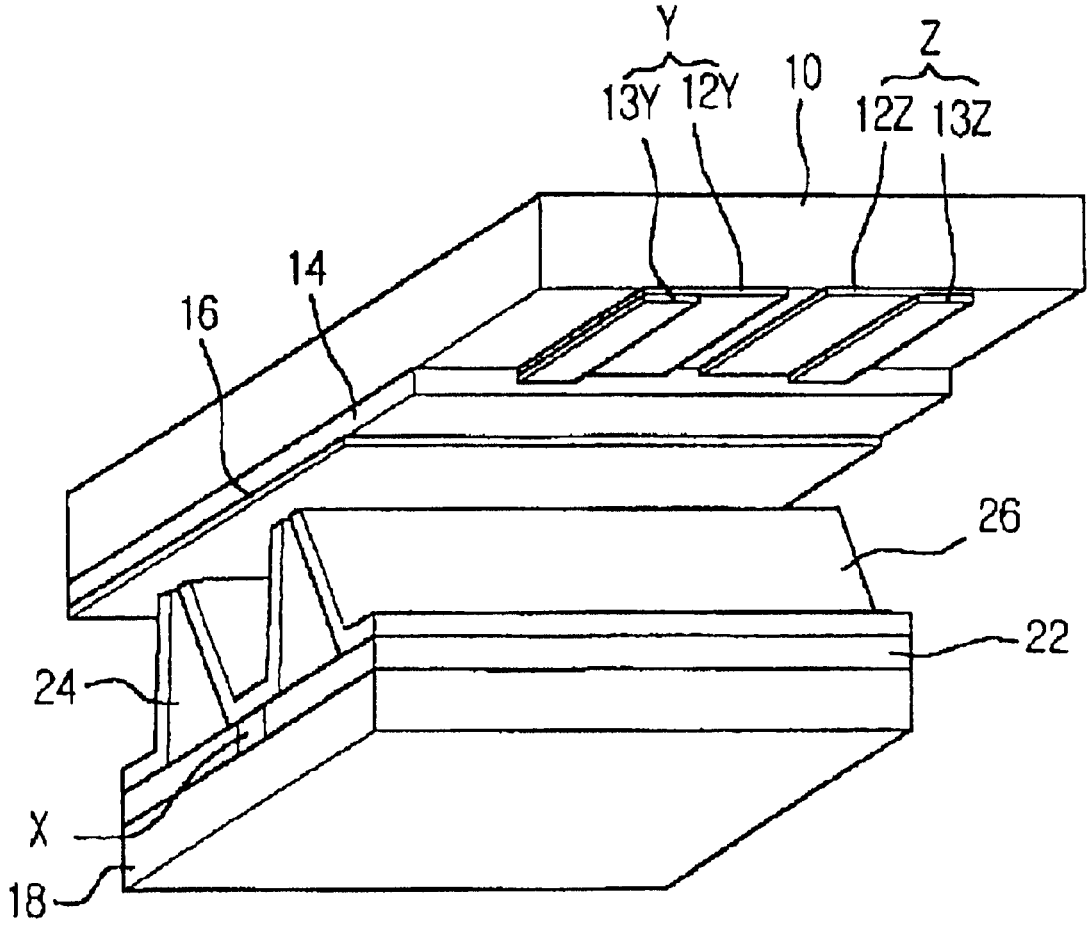
Fig.1 Related Art
FIG. 1 is a perspective view of a discharge cell of a PDP.
Figure 2:
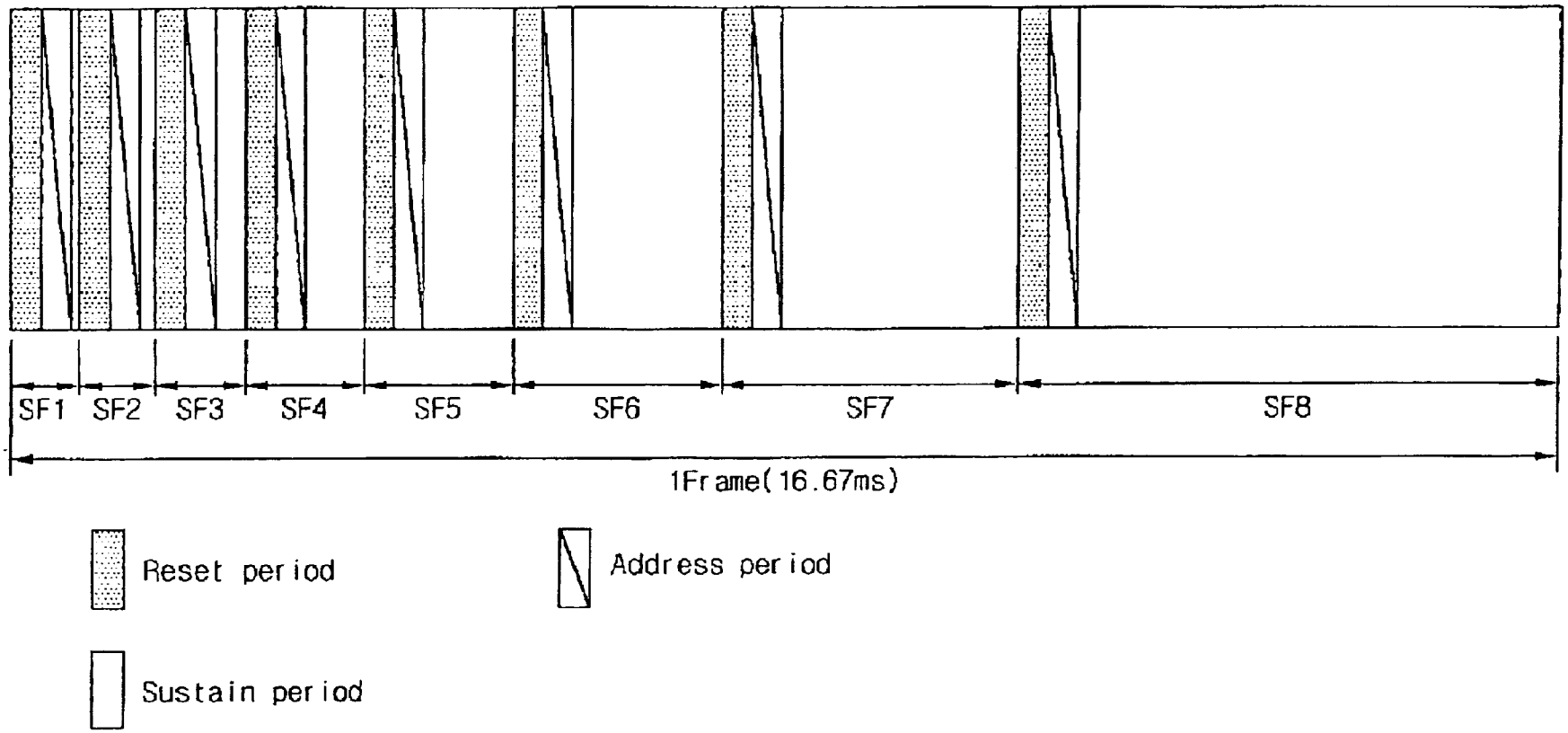
Fig.2 Related Art
FIG. 2 illustrates a frame to represent 256 gray levels in a general PDP.
Figure 3:
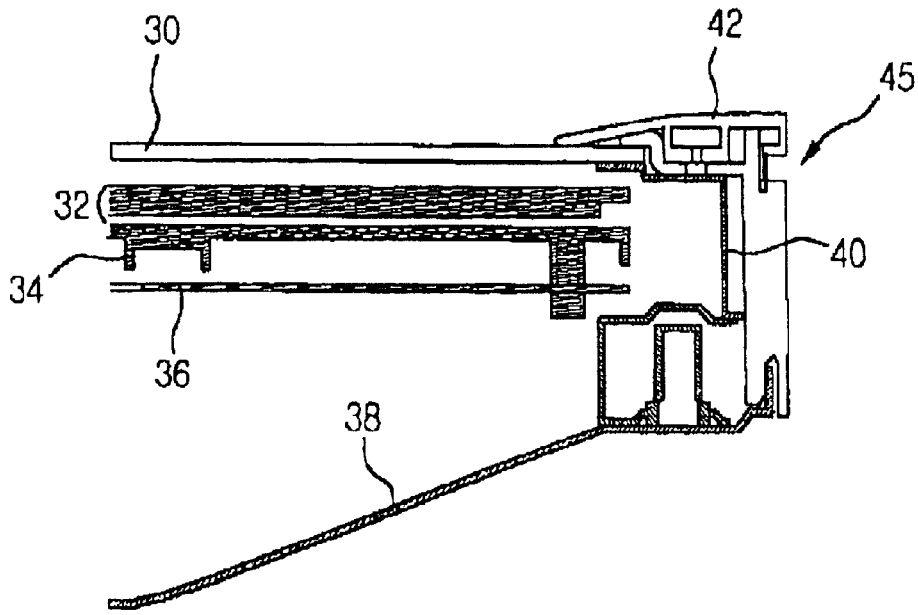
Fig.3 Related Art
FIG. 3 is a schematic cross-sectional view of a portion of a plasma display apparatus of the related art.
Figure 4:
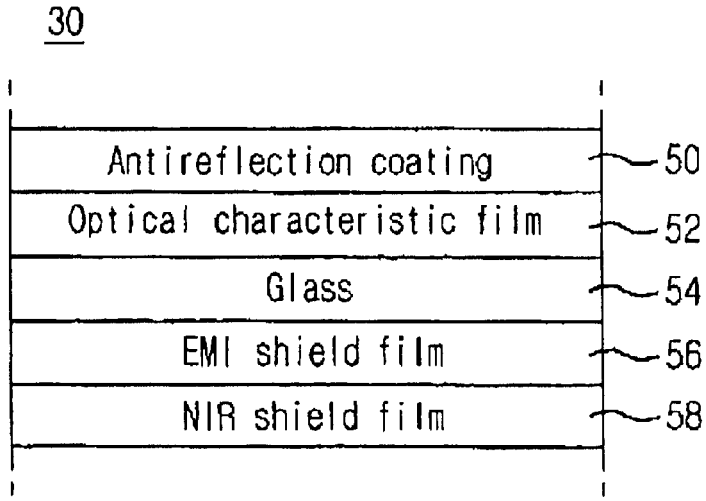
Fig.4 Related Art
FIG. 4 is a schematic cross-sectional view of an front filter of FIG. 3.
Figure 5:
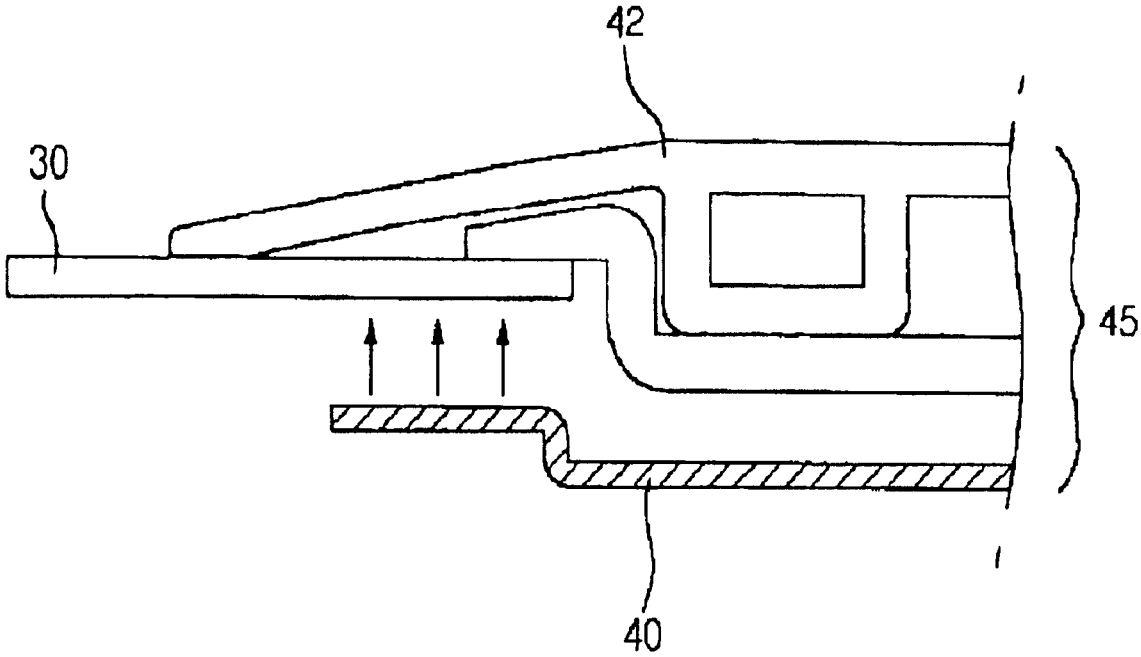
Fig.5 Related Art
FIG. 5 illustrates that a filter supporter is attached to an front filter of FIG. 3.
Figure 6:
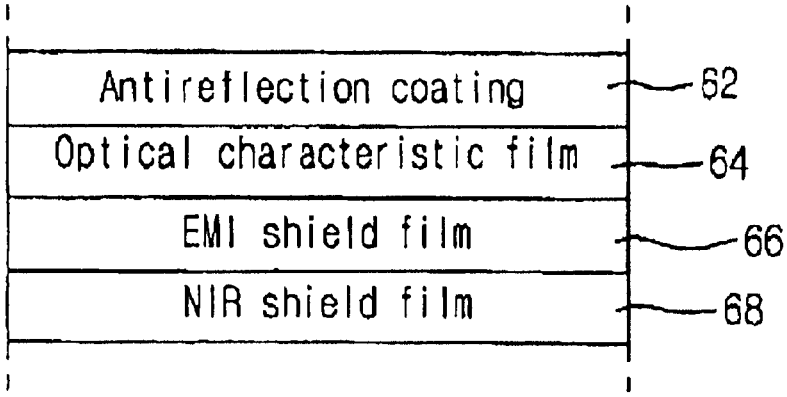
Fig.6 Related Art
FIG. 6 illustrates a film-type front filter of the related art schematically.

Referring to FIG. 7, a plasma display apparatus of the present invention includes a panel 72, a film-type front filter 74, a chassis base, a heat sink plate, a back cover, and a filter supporter 76. The panel 72 is formed by attaching an upper substrate to a lower substrate. The film-type front filter 74 is attached to an entire surface of the panel 72. The chassis base supports the panel 72 and has a PUB upon which various drivers are installed. The heat sink plate is attached to the entire surface of the chassis base. The back cover is formed on a rear surface of the chassis base. The filter supporter 76 connects the back cover electrically to the film-type front filter 74. Though the chassis base, the heat sink plate, the back cover and a front cabinet are not shown in FIG. 7, they must be fully understood referring to FIG. 3.

The film-type front filter 74 may be larger area the panel 72. For example, the film-type front filter 74 may be provided with extension 79 extending by predetermined lengths from edges of the panel in omni-directions. The extension 79 may farther extend by 2 mm–300 mm from the edges of the panel 72. Note that the extension 79 extends in omni-directions. Accordingly, the film-type front filter 74 may extend by 4 mm–600 mm horizontally and vertically. The extension 79 may be formed of the same material as the filter supporter and integrated with the filter supporter.

To achieve this, metallic material 78 is formed to surround the extensions 79. The metallic material 78 may be any conducting material. The metallic material 78 is shaped of a plate and may be attached to the extension to surround the extension. To enhance the adherence between the metallic material 78 and extension, additional adherent agent may be coated on inner surface of the metallic material 78.

The Metallic material 79 may be electrically connected to at least one film of an NIR shield film and an EMI shield film of the film-type front filter 74. Therefore, the electrical signal generated from the NIR shield film and the EMI shield film may be released to the external through the metallic material 79.

Accordingly, the metallic material 79 attached to the extension 79 may be electrically connected to the filter supporter 76.

Figure 8:
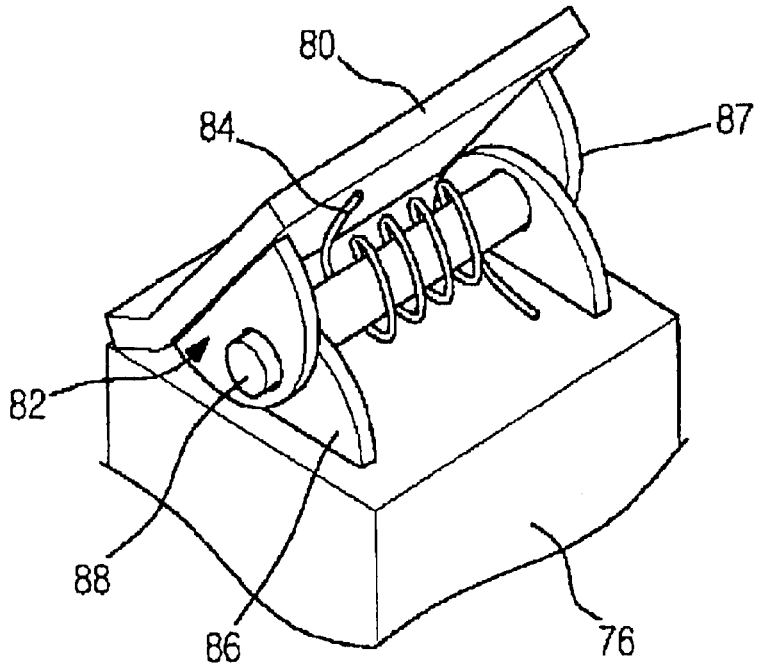
FIG. 8 is a detailed perspective view of a filter supporter of FIG. 7.

To achieve this, the filter supporter is provided with a clip 80 and a flange 82 thereon as shown in FIG. 8. The clip 80 may rotate with respect to a predetermined shaft in pitching directions. The flange 82 connects the filter supporter 76 with the clip 80. The flange includes a first projection 86, a second projection 87, a guide member 88 and a coil spring 84. The first projection 86 extends from the filter supporter 76 and has a first hole (not shown) penetrating the first projection 76. The second projection 87 extends from the clip and has a second hole (not shown) penetrating the second projection 87. The guide member 88 penetrates the first and second holes and fixedly connects the first and second projections 86 and 87. The coil spring 84 is formed to surround the guide member 88 so as to give elastic force to the clip 80.

The clip 80 may be electrically connected to the filter supporter 76 through the flange 82.

Accordingly, when an end of the clip 80 is rotated downwards, the other end of the clip 80 is rotated upwards to be widened. Then, the metallic material 78 attached to the extension 79 of the film-type entire filter 74 is mounted on the filter supporter 26. Then, if the clip 80 is loosened, the end of the clip 80 is rotated upwards and the other end of the clip 80 is rotated downwards such that the metallic material is fixed. Therefore, the clip 80 is electrically connected to the metallic material.

Consequently, the extension 79 of the film-type entire filter 74 is electrically connected to the metallic material 78 and the metallic material 78 may be electrically connected to the clip 80 and the filter supporter 76. The clip 80 may be electrically connected to the filter supporter 76 through the flange 82.

Therefore, the NIR signal or the EMI signal generated from the film-type front filter 74 is transferred to the filter supporter 76 to be released to the external via the metallic material 78, the clip 80 and the flange 82.

In this embodiment of the present invention, the film-type front filter 74 may be electrically connected to the filter supporter 76 by the clip 80 and the flange 82 formed on the filter supporter 76. The film-type front filter 74 may further include an extension 79 such that the area where the film-type front filter 74 contacts the filter supporter 76 can be more occupied. Therefore, the NIR signal or the EMI signal can be more rapidly released to the external.

The extension 79 extending from the panel 72 is provided on the film-type front filter 74 to connect an end of the extension 79 to the filter supporter 76 by the clip 80. The filter supporter 76 is separated from the panel 72 by a predetermined distance such that the panel 72 may be protected from the impact applied to the filter supporter 76.

As described above, according to the present invention, the extension is formed to have the film-type entire filter whose area is larger than the panel. Then, the extension is surrounded by the metallic material. The extension of the film-type front filter may be contacted to the filter supporter using the clip provided on the filter supporter such that the film-type entire filter may be easily connected to filter supporter Accordingly, a filter supporter is connected to an end of the extension of the film-type entire filter such that the panel is separated the filter supporter by a predetermined distance and the panel is prevented from being damaged due to the impacts applied to the filter supporter 4.

The filter supporter is connected to the extension of the film-type front filter with larger area. The NIR signal and the EMI signals generated by the film-type front filter may easily be released to the outside through the filter supporter.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A plasma display apparatus comprising:

a panel formed by attaching an upper substrate to a lower substrate;

[an] *a* front filter [attached] *mounted* to an entire surface of the panel and comprising an extension extending by predetermined lengths from edges of the panel in omni-directions;

a back cover formed [on] *to be spaced from* a rear surface of the [chassis base] *front filter*; and a filter supporter for electrically connecting the extension to the back cover.

2. The plasma display apparatus according to claim 1, wherein the extension farther extends by 2 mm–300 mm from the edges of the panel.

3. The plasma display apparatus according to claim 1, wherein the extension is formed of the same material as the [film-type entire] *front* filter and integrated with the [film-type entire] *front* filter.

4. The plasma display apparatus according to claim 1, wherein the [film-type entire] *front* filter further comprises metallic material formed to surround the extension.

5. The plasma display apparatus according to claim 4, wherein the metallic material is any conducting material.

6. The plasma display apparatus according to claim 4, wherein the metallic material is electrically connected to at least one film of an NIR (near infrared ray) shield film and an EMI (electromagnetic interference) shield film of the [film-type] front filter.

7. The plasma display apparatus according to claim 1, wherein the filter supporter comprises:

a clip for rotating with respect to a guide member in pitching direction; and a flange for connecting the filter supporter with the clip.

8. The plasma display apparatus according to claim 7, wherein the extension is connected to the filter supporter by the clip.

9. The plasma display apparatus according to claim 7, wherein the flange comprises:

a first projection extending from the filter supporter and having a first hole penetrating the first projection;

a second projection extending from the clip and having a second hole penetrating the second projection;

a guide member penetrating the first and second holes, for fixedly connecting the first and second projections; and a coil spring formed to surround the guide member so as to give elastic force to the clip.

*10. The plasma display apparatus according to claim 2, wherein the front filter is a film-type filter.*

* * * * *